United States Patent [19]

Botez et al.

[11] Patent Number: 4,866,724
[45] Date of Patent: Sep. 12, 1989

[54] WIDE-WAVEGUIDE INTERFEROMETRIC ARRAY WITH INTERELEMENT LOSSES

[75] Inventors: Dan Botez, Redondo Beach; Luke J. Mawst, Torrance, both of Calif.

[73] Assignee: TRW Inc., Redondo Beach, Calif.

[21] Appl. No.: 233,390

[22] Filed: Aug. 18, 1988

Related U.S. Application Data

[63] Continuation-in-part of Ser. No. 921,648, Oct. 21, 1986, and a continuation-in-part of Ser. No. 180,415, Apr. 12, 1988.

[51] Int. Cl.$^4$ ............................................... H01S 3/19
[52] U.S. Cl. .......................................... 372/50; 372/46; 372/48
[58] Field of Search .................. 372/50, 45, 46, 19, 372/18, 48

[56] References Cited

U.S. PATENT DOCUMENTS

| | | | |
|---|---|---|---|
| 4,641,311 | 2/1987 | Ackley | 372/18 |
| 4,723,252 | 2/1988 | Botez et al. | 372/48 |
| 4,764,929 | 8/1988 | Thaniyavarn | 372/19 |
| 4,772,082 | 9/1988 | Matsui et al. | 372/50 |

Primary Examiner—James W. Davie
Attorney, Agent, or Firm—Noel F. Heal; Sol L. Goldstein

[57] ABSTRACT

A semiconductor laser diode array structure in which interelement losses are deliberately included, to favor operation at higher-order array modes of operation, and thereby avoid the disadvantage of beam broadening that results when lower-order array modes of operation are used at very high drive currents. To provide a desirable far-field radiation pattern, the structure includes a wide-waveguide interferometric configuration to select only the lowest of the higher-order modes. The desired interelement losses are obtained in the illustrative embodiment by a buffer layer that provides antiguiding in a transverse direction, but only in the interelement regions. The buffer layer is transparent, for strong interelement coupling and stability of operation. The illustrative embodiment was operated at drive currents in excess of four times threshold current, and with beam broadening only slightly above the diffraction limit.

10 Claims, 5 Drawing Sheets

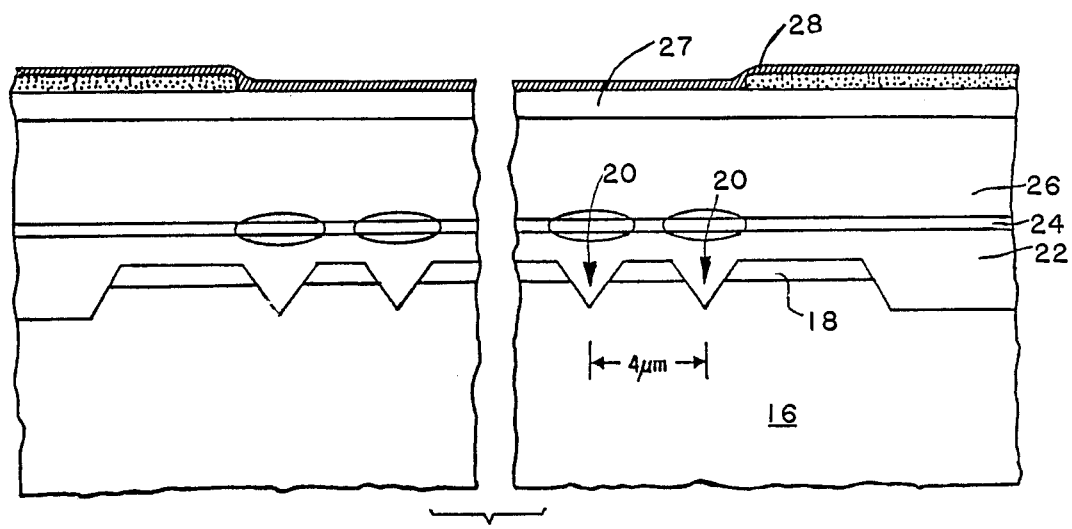
FIG. 1
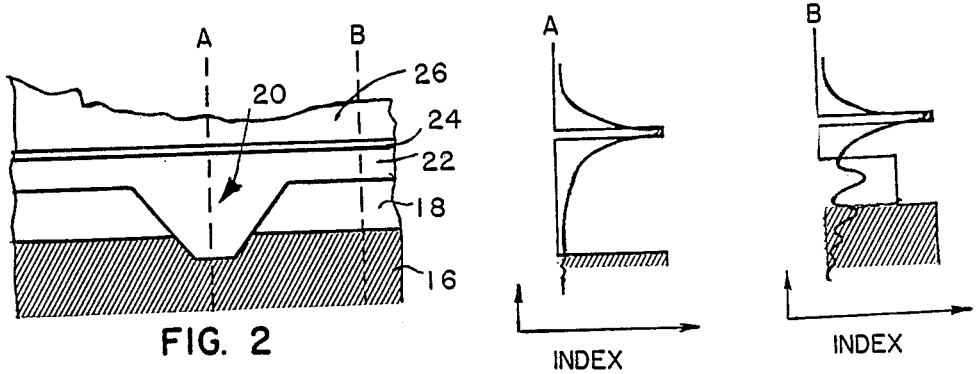
FIG. 2
FIG. 4a
FIG. 4b
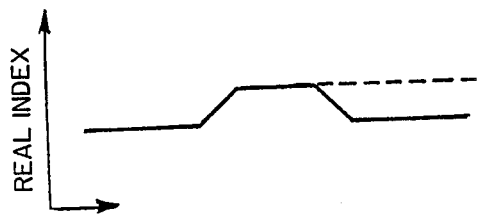
FIG. 3

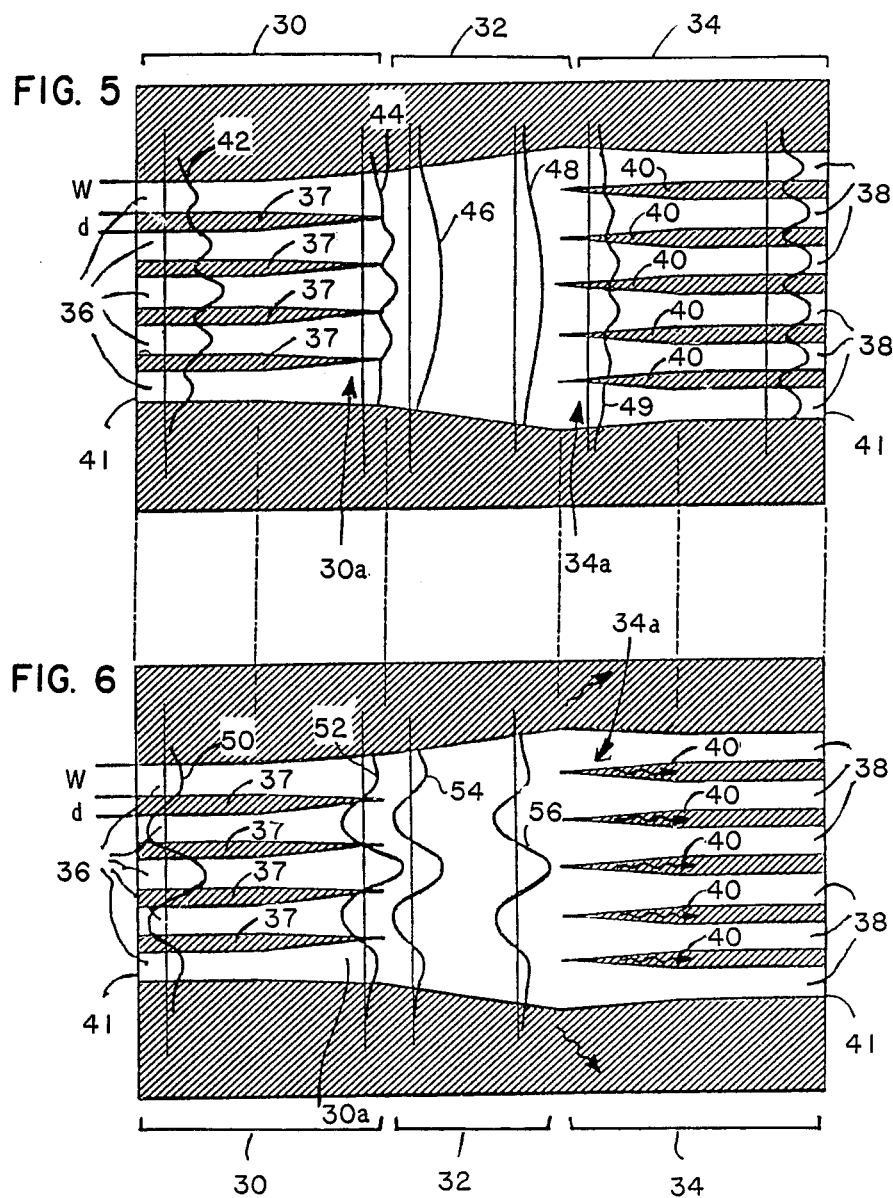

PHASE SHIFTERS

WIDE-WAVEGUIDE INTERFEROMETRIC ARRAY WITH INTERELEMENT LOSSES

CROSS-REFERENCE TO RELATED APPLICATIONS

This is a continuation-in-part of the following two applications:

(1) Ser. No. 06/921,648 filed Oct. 21, 1986 by Dan Botez, entitled "Laser Array with Wide-Waveguide Coupling Region."

(2) Ser. No. 07/180,415 filed Apri. 12, 1988 by Dan Botez et al., entitled "Phase-Locked Array of Semiconductor Lasers Using Closely Spaced Antiguides."

BACKGROUND OF THE INVENTION

This invention relates generally to semiconductor diode lasers and, more particularly, to one-dimensional arrays of semiconductor diode lasers fabricated as single structures. Single-element diode lasers are limited in power to outputs of the order of 30 milliwatts (mW), but arrays of diode lasers can be designed to provide output powers of hundreds of milliwatts. Such high power outputs are useful in optical communications systems, laser printers and other applications.

A survey of the state of the art of phase-locked laser arrays can be found in a paper entitled "Phase-Locked Arrays of Semiconductor Diode Lasers," by Dan Botez and Donald Ackley, IEEE Circuits and Devices Magazine, Vol. 2, No. 1, pp. 8–17, January 1986.

By way of general background, a semiconductor diode laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer usually have a lower index of refraction than the active layer, and function as cladding layers in a dielectric waveguide that confines the light in a direction perpendicular to the layers. Various techniques are usually employed to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

Most semiconductor structures employed for lateral index guiding in laser arrays are known as positive-index guides, i.e. the refractive index is highest in regions aligned with the laser elements and falls to a lower value in regions between elements, thereby effectively trapping light within the laser elements. Another type of index guiding is referred to as negative-index guiding, or antiguiding, wherein the refractive index is lowest in the regions aligned with the laser elements and rises to a higher value between elements. Some of the light encountering the higher refractive index material will leak out of the lasing element regions; hence the term leaky-mode laser array is sometimes applied.

In general, an array of laser emitters can oscillate in one or more of multiple possible configurations, known as array modes. In what is usually considered to be the most desirable array mode, all of the emitters oscillate in phase. This is known as the fundamental or 0°-phase-shift array mode, and it produces a far-field pattern in which most of the energy is concentrated in a single lobe, the width of which is limited, ideally, only by the diffraction of light. When adjacent laser emitters are 180° out of phase, the array operates in the 180°-phase-shift array mode, and produces two relatively widely spaced lobes in the far-field distribution pattern. Multiple additional modes exist between these two extremes, depending on the phase alignment of the separate emitters, and in general there are N possible array modes for an N-element array. Many laser arrays operate in two or three array modes simultaneously and produce one or more beams that are typically two or three times wider than the diffraction limit.

One way to increase the power output of a laser array is to operate it at high current drive levels well above the lasing threshold. However, when evanescently-coupled devices that operate in the fundamental array mode at threshold level are driven in excess of 50% above threshold, their beams broaden, as a result of an effect known as spatial hole burning, and stable array-mode operation cannot be achieved. By providing for strong optical-mode confinement, using positive-index guiding for the elements, spatial hole burning is effectively suppressed, but so is the evanescent coupling between elements. One solution to this difficulty is to provide interelement coupling via Y-shaped branches. However, Y-branch coupling is relatively weak and results in emitted beams that are as much as four times larger than the diffraction limit.

The second cross-referenced application Ser. No. 07/180,415 discloses one solution to this problem, in a device that employs lateral antiguiding to provide both strong mode confinement and strong interelement coupling. The device operates at higher powers without being affected by spatial hole burning and with a desirable far-field distribution pattern. The present invention is directed to an alternative solution permitting operation at higher drive currents without being affected by spatial hole burning.

SUMMARY OF THE INVENTION

The present invention resides in a semiconductor laser array structure that can be operated at large drive currents and in a selected higher-order array mode. Since spatial hole burning is not a limiting factor when operating in higher-order array modes, a desirable mode of operation is one that favors higher-order modes but at the same time selects a single mode for stable operation and a desirable far-field radiation pattern. The structure of the invention includes means between multiple devices of the array, for increasing interelement losses and thereby favoring operation at higher-order modes. The structure also includes additional means favoring the selection of the lowest of the possible array modes. For example, an illustrative embodiment of the invention favors operation in array modes 8, 9 and 10, and the means for selecting a particular mode favors the lowest of the modes and selects mode 8 for operation of the array.

More specifically, the structure of the invention comprises means for producing lasing action in a semiconductor structure, including a substrate, an active semiconductor layer, electrodes for applying a voltage across the active layer, and a pair of reflective facets, at least one of which is an emitting facet, located at opposite ends of the array structure; and an array of waveguides with parallel longitudinal axes, formed in the structure and including semiconductor structural means between the waveguides to provide interelement regions of increased loss between the waveguides, to favor higher-order array modes. In addition, the invention includes means for favoring operation in a selected array mode exclusively.

In the illustrative embodiment of the invention, the means to provide interelement losses includes a buffer layer that operates in part as a transverse antiguide. Preferably, the buffer layer is transparent to provide strong coupling between elements, and for stability of operation.

The means for favoring operation in a selected array mode includes an interferometric structure favoring operation in the lowest of the available modes. More specifically, the interferometric structure includes a second set of waveguides with parallel longitudinal axes, and a wide-waveguide section, having one end coupled to the first set of waveguides and an opposite end coupled to the second set of waveguides, and having a width approximately equal to the combined width of one of the first and second sets of waveguides. In one exemplary form of the invention with ten laser elements the interelement losses favor lasing in the 8th, 9th and 10th array modes, and the interferometric structure selects only the 8 th mode and discriminates against the other two modes.

It will be appreciated from the foregoing that the present invention represents a significant advance in the field of semiconductor laser arrays. In particular, the invention permits operation at relatively high powers and drive currents without the beam broadening effects that result from spatial hole burning in other structures. Other aspects and advantages of the invention will become apparent from the following more detailed description, taken in conjunction with the accompanying drawings.

BRIEF DESCRIPTION OF THE DRAWINGS

FIG. 1 is a fragmentary cross-sectional view of an array of semiconductor laser diodes in accordance with the invention;

FIG. 2 is a cross-sectional view similar to FIG. 1 but showing only a single laser element;

FIG. 3 is graph showing the variation of real index of refraction with lateral position across the element of FIG. 2;

FIG. 4a is a graph showing the variation of real index of refraction with transverse position along the broken line A of FIG. 1;

FIG. 4b is a graph showing the variation of real index of refraction with transverse position along the broken line B of FIG. 1;

FIG. 5 is a diagrammatic plan view of a wide waveguide interferometric array of the type employed in the present invention, showing how the structure favors operation in the fundamental array mode;

FIG. 6 is a diagrammatic plan view of a wide waveguide interferometric array of the type employed in the present invention, showing how the structure discriminates against operation in the 180°-phaseshift array mode;

DESCRIPTION OF THE PREFERRED EMBODIMENT

Figure 7:
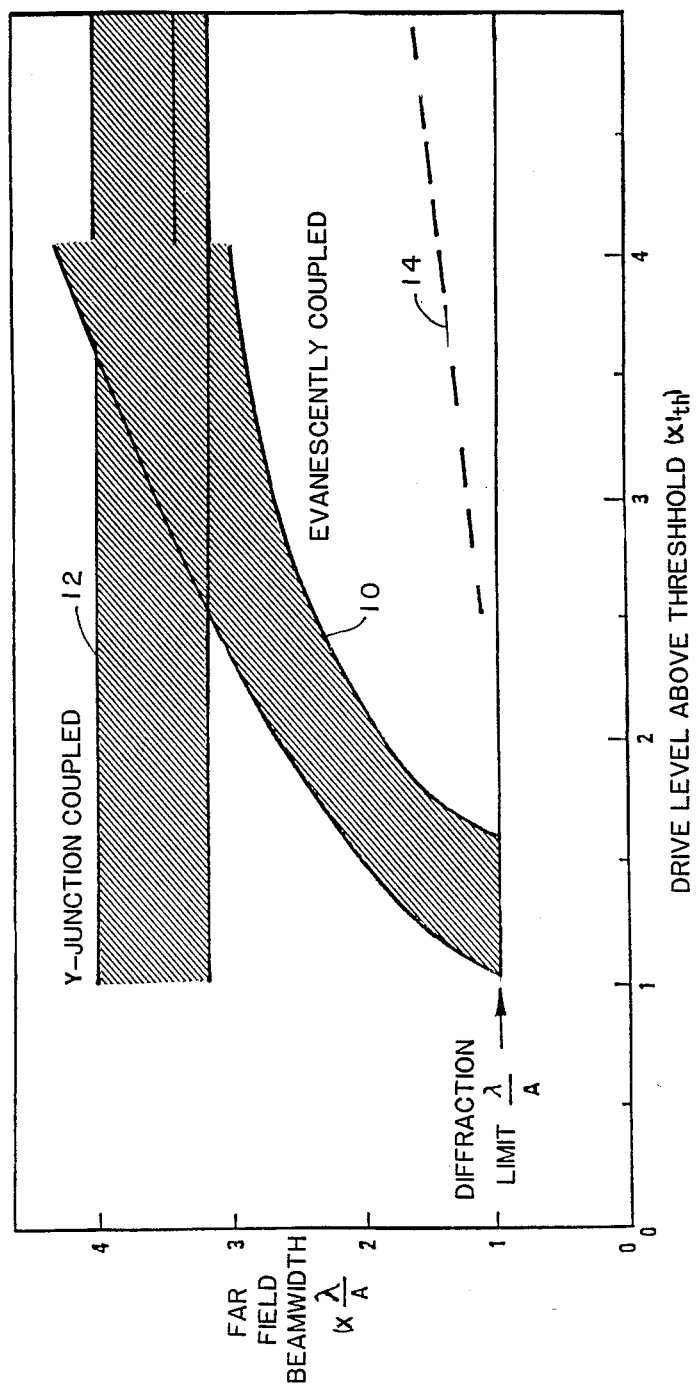
FIG. 7 is graph comparing the variation of far-field beamwidth with drive level above threshold current for various types of arrays, including Y-junction coupled arrays, evanescently coupled arrays, and the array of the present invention.

As shown in the drawings for purposes of illustration, the present invention is principally concerned with improvements in semiconductor diode laser arrays. There is a need in some applications to be able to drive semiconductor laser arrays at increasingly higher powers and drive currents. However, the far-field beamwidth increases at high drive currents, principally because of the effect of spatial hole burning. Ideally, it is desirable to avoid beam broadening very much beyond the diffraction limit. A diffraction-limited beam is one whose spatial spread is limited only by the diffraction of light, to a value roughly proportional to the wavelength of the emitted light divided by the width of the emitting source.

As shown in FIG. 7, evanescently coupled semiconductor arrays follow the curved band indicated generally by reference numeral 10. Although a diffraction-limited beam may be obtained for drive currents of up to fifty percent above threshold, above that level the beam broadens rapidly to three or four times the diffraction limit when the drive current is four times threshold current. One proposed solution to this difficulty is to use Y-junction coupling in the array, since Y-junction-coupled arrays are relatively insensitive to spatial hole burning. However, Y-junction arrays also have a far-field beamwidth of three to four times the diffraction limit, as indicated at 12 in FIG. 7.

The present invention provides a far-field beamwidth ranging from just above the diffraction limit, to nearly twice the diffraction limit for drive currents up to four to five times threshold current, as indicated by the curve 14 in FIG. 7.

In accordance with the invention, an array of semiconductor diode lasers includes an interelement structure that provides for increased interelement losses and strong interelement coupling. The essence of the invention is depicted in FIGS. 1–4. As shown in FIGS. 1 and 2, the semiconductor array structure includes a substrate 16 of p+ type gallium arsenide (GaAs) on which is formed a buffer layer 18 of n or p type aluminum gallium arsenide having 10% aluminum ($Al_{0.1}Ga_{0.9}As$). The lasing element is defined in part by V-shaped channels 20 formed through the buffer layer 18 and part-way into the substrate 16. Formed over the channel 20 and the buffer layer 18 is a first cladding layer 22 of p type aluminum gallium arsenide having 30% aluminum ($Al_{0.3}Ga_{0.7}As$). An active layer 24 of undoped GaAs is formed over the first cladding layer 22, and a second cladding layer 26 of n type $Al_{0.3}Ga_{0.7}As$ is formed over the active layer. The active layer 24 is undoped and the cladding layers 22 and 26 are appropriately doped to provide a diode action across the active layer as a p-n junction. The structure is capped with an layer 27 of n+ type gallium arsenide and a metal layer 28 for electrical contact. An additional contact layer (not shown) is formed on the undersurface of the substrate 16.

As viewed in lateral cross section, the structure of FIG. which is shown to a smaller scale in FIG. 2, exhibits conventional positive-index guiding, as shown in FIG. 3. That is to say, the real index of refraction increases slightly in the region associated with the channel 20 and drops off on both sides to provide positive real index guiding in the lateral sense. The buffer layer 18 provides a different effect in the transverse axis, perpendicular to the channel 20 and to the lateral direction. In a region centered above the channel 20, such as the one indicated by the line A, the variation of real index of refraction is shown in FIG. 4a as providing positive index guiding, that is to say the index peaks at the active layer 24 and drops off rapidly on each side of the active layer.

In the interelement region indicated by the line B, a different effect takes place, as determined by the presence of the buffer layer 18. The index, shown in FIG. 4b, falls then rises again in the buffer layer; then falls off again and rises once more at the interface with the substrate. The overall effect is to provide a significant transverse antiguiding loss in the interelement regions. In addition, the buffer layer 18 is non-absorbing, i.e. it is a transparent layer, and this provides strong interelement coupling and stability of operation.

Interelement losses favor the support of higher-order array modes. This can be intuitively understood from the observation that higher-order array modes produce nulls between elements. The deliberate introduction of losses between the elements conforms to this pattern of nulls and, therefore, strongly favors the higher-order array modes. For a uniform array of, for example, ten semiconductor laser elements, the introduction of interelement losses results in operation in the 8th, 9th and 10th modes. These combined modes do not produce a desirable far-field pattern unless the structure is further modified in accordance with a second major feature of the invention. It has been shown in the first of cross-referenced applications that an array structure with a wide-waveguide interferometric coupling region favors the lowest-order array mode of operation. In the cross-referenced application, it was explained how this fundamental mode was selected over others. In the present invention the fundamental mode is deliberately avoided, by use of the interelement losses that are built into the structure. The wide-waveguide interferometric array structure in this case provides a reliable technique for selecting the lowest of the array modes available. For an array capable of operation in the 8th, 9th and 10th array modes, the wide-waveguide structure results in selection of the 8th mode exclusively.

FIGS. 5 and 6 show a wide-waveguide interferometric array having five and six channels in its two array segments. The structure consists of three waveguide sections 30, 32 and 34. The first waveguide section 30 has a plurality of parallel waveguides 36, and includes a transition section 30a in which the waveguides 36 become progressively wider until they merge as one into the second waveguide section 32, which is a single wide waveguide of approximately the same width as the first and third sections 30 and 34. The waveguides 36 are defined in part by inter-waveguide regions 37, which are tapered to a negligible width at the transition to the wide-waveguide section 32. The third waveguide section 34 also includes a plurality of parallel waveguides 38, which become progressively wider in a transition section 34a, merging as one into the centrally positioned wide-waveguide section 32. The waveguides 38 are defined in part by inter-waveguide regions 40, which are tapered to a negligible width at the transition to the wide-waveguide section 32. The waveguides 38 have the same uniform spacing as the waveguides 36, but are not aligned with the waveguides 36. Preferably, the waveguides 38 are aligned with the inter-waveguide regions 37 between the waveguides 36. For symmetry, the number of waveguides 38 is one greater than the number of waveguides 36. In the present invention, an exemplary structure has ten and eleven elements in the two waveguide sections 30 and 34.

The structure also includes opposed reflective end facets 41, from which light is repeatedly reflected to promote lasing within the structure. Light is ultimately emitted from one of the end facets 41 in a direction perpendicular to the facet.

If all of the waveguides 36 were excited in phase, in the 0°-phase-shift array mode, the resultant mode of oscillation would be as shown at 42, and again at 44 at the transition with the wide-waveguide section 32. This mode couples easily to the wide-waveguide section 32, because its amplitude and phase variations closely match those of the wide-waveguide section, as indicated by the correspondence between the fundamental array mode, as indicated at 44, and the fundamental mode of the wide-waveguide section, indicated at 46. The fundamental mode of oscillation in the opposite end of the wide-waveguide section 32 is shown at 48. At the transition from the wide-waveguide section 32 to the third waveguide section 34, there is again a relatively strong coupling and the 0°-phase-shift array mode is induced in the third waveguide section 34, as indicated at 49.

FIG. 6 shows the same structure as FIG. 5, but with the first waveguide section 30 excited in the 180°-phase-shift array mode, i.e. with adjacent waveguides 36 out of phase with each other. The mode is shown graphically at 50 and 52. Since the wide-waveguide section 32 has many possible modes of oscillation, there is still good coupling of the out-of-phase array mode to the wide-waveguide section mode, as shown at 54. However, the coupling of the wide-waveguide mode at 56 to the third waveguide section 34 is very weak, because the physical positions of the waveguides 38 are not aligned with the modes derived from the positions of the waveguides 36 in the first waveguide section 30. Therefore, the configuration discriminates strongly against the 180°-phase-shift array mode and favors the 0°-phase-shift array mode. Stated more generally, the structure of FIGS. 5 and 6 favors operation in the lowest order array mode, which, for a ten/eleven element array with interelement losses is the 8th mode.

Figure 8:
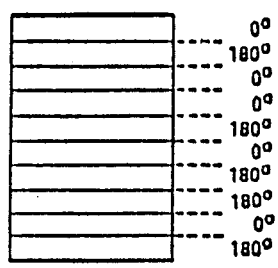
FIG. 8 is a diagram showing the phase distribution of the output from the array of the present invention having 10 and 11 elements and operating in array mode number 8.
Figure 9:
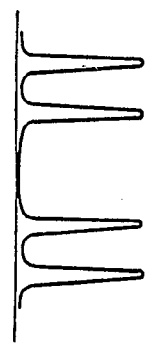
FIG. 9 is a graph showing the far-field pattern corresponding to the device of FIG. 8.
Figure 10:
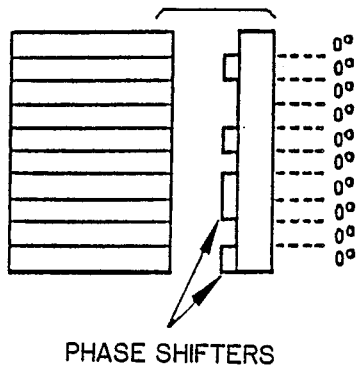
FIG. 10 is a diagram similar to FIG. 8, but showing the effect of selective phase shifters on the output phase distribution.
Figure 11:
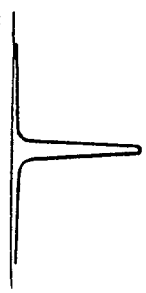
FIG. 11 is a graph showing the far-field pattern corresponding to the device of FIG. 10.
Figure 12:
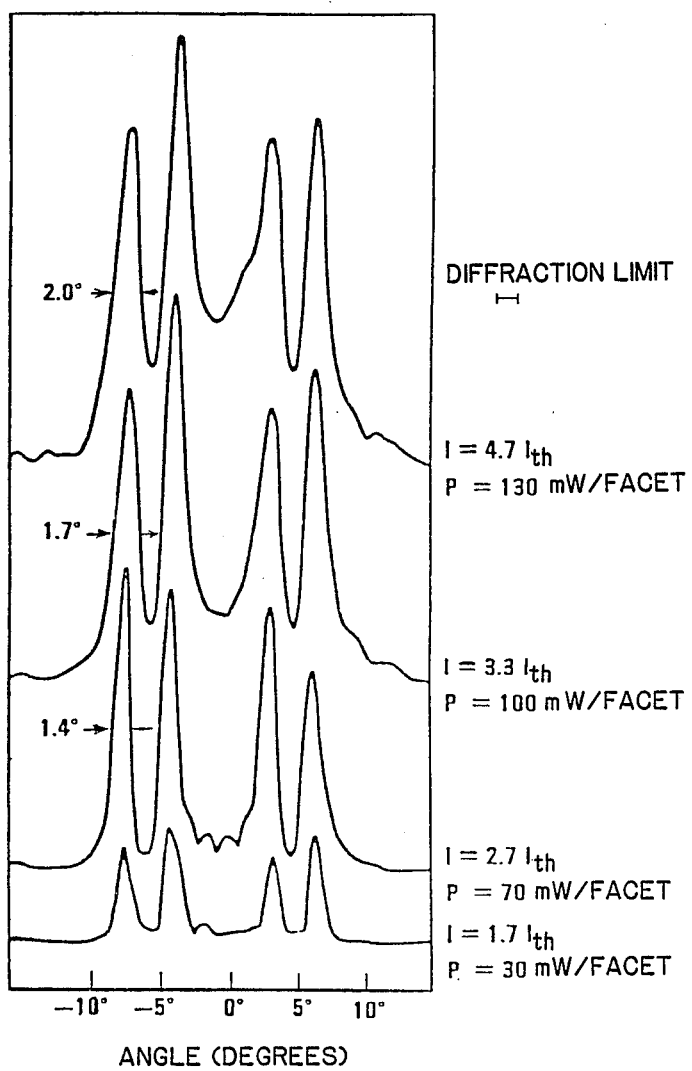
FIG. 12 is a set of graphs showing the lateral far-field distribution patterns from an array fabricated in accordance with the invention in a liquidphase epitaxial (LPE) process.

FIG. 8 shows the phase distribution at the output from an array of the type described, operating in the 8th array mode. It will be noted that the second, fifth, seventh, eighth and tenth elements produce an output that is 180 degrees out of phase with the other elements. This results in a four-lobed farfield pattern, as indicated generally in FIG. 9, and as shown in more detail in the multiple graphs plotted in FIG. 12 for various power levels up to 4.7 times the threshold current. This farfield pattern can be improved by the addition of 180-degree phase shifting devices positioned at the outputs of the array, as shown in FIG. 10. These may take the form of variable-thickness facet coatings, or phase-shifting may be effected by selectively varying the array element widths. The addition of phase shifters at the outputs of the second, fifth, seventh, eighth and tenth elements, produces a composite output that is in phase at all outputs, and produces a single-lobed far-field pattern, as shown in FIG. 11.

Figure 13:
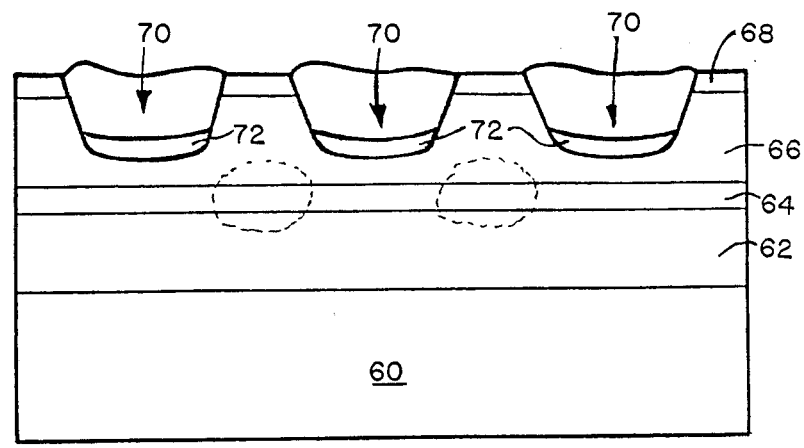
FIG. 13 is a fragmentary cross-sectional view of a metal-organic chemical vapor deposition (MOCVD) grown structure fabricated in accordance with the invention.

FIG. 13 is an exemplary form of the invention fabricated using a metal-organic chemical vapor deposition (MOCVD) process. The structure includes an n+ type substrate 60 of gallium arsenide (GaAs), on which is formed an n type layer 62 of $Al_{0.4}Ga_{0.6}As$. An active layer 64 of undoped GaAs is next formed over the layer 62. The active layer, of thickness of about 100 Angstroms, is sandwiched between two additional layers of $Al_{0.2}Ga_{0.8}As$ (not shown), each about 2,000 Angstroms thick, the lower one being of n type material and the upper one being of p type material. Above the active layer 64 is another layer 66 of $Al_{0.4}Ga_{0.6}As$ of p type material. A cap layer 68 of p+ type gallium arsenide is formed over the structure, and multiple channels 70 are formed to extend through the layers 68 and 66. The bottom of each channel 70 contains a buffer layer 72 that performs the same function as the buffer layer 18 in embodiment shown in FIG. 1. The remainder of the channels are filled with n type aluminum gallium arsenide. The oval-shaped outlines 74 indicate the lasing regions of the device, which performs in basically the same manner as the FIG. 1 embodiment of the invention.

It will also be appreciated that, although two embodiments of the invention have been described in detail for purposes of illustration, various modifications may be made without departing from the spirit and scope of the invention. Accordingly, the invention is not to be limited except as by the appended claims.

We claim:

1. A semiconductor laser array structure, comprising:
    means for producing lasing action in a semiconductor structure, including a substrate, an active semiconductor layer, cladding layers, electrodes for applying a voltage across the active layer, and a pair of reflective facets, at least one of which is an emitting facet, located at opposite ends of the array structure; and
    an array of waveguides with parallel longitudinal axes, formed in the structure and including semiconductor structural means between the waveguides to provide interelement regions of increased loss between the waveguides, to favor higher-order array modes; and
    means for favoring operation in a selected array mode exclusively;
    and wherein the means to provide interelement losses includes a buffer layer having an intermediate index of refraction between the index of refraction of the cladding layers and the index of refraction of the substrate, to provide sufficient transverse antiguiding in the interelement regions to favor operation in a higher-order array mode.

2. A semiconductor laser array structure as defined in claim 1, wherein:
    the buffer layer is transparent to provide strong coupling between elements.

3. A semiconductor laser array structure as defined in claim 1, wherein:
    the means for favoring operation in a selected array mode includes an interferometric structure favoring operation at the lowest of the higher-order modes.

4. A semiconductor laser array structure as defined in claim 3 wherein the interferometric structure includes:
    a second set of waveguides with parallel longitudinal axes; and
    a wide-waveguide section, having one end coupled to the first set of waveguides and an opposite end coupled to coupled to the second set of waveguides, having a length sufficient to support a single lateral mode in the wide-waveguide section, and having a width approximately equal to the combined width of one of the two sets of waveguides.

5. A semiconductor layer array structure, comprising:
    a relatively wide waveguide section;
    a first set of waveguides with parallel longitudinal axes, coupled to one end of the wide-waveguide section, and having an active layer and cladding layers fabricated on a semiconductor substrate;
    a second set of waveguides with parallel longitudinal axes, coupled to the other end of the wide-waveguide section, and having an active layer and cladding layers fabricated on a semiconductor substrate;
    as pair of reflective facets, at least one of which is an emitting facet, located at opposite ends of the array structure; and
    structural means located between the waveguide elements of both first and second sets of waveguides, providing significant interelement losses and therefore favoring operation at higher-order array modes;

wherein the structural means providing inter-element losses includes a structural layer providing antiguiding in a transverse direction, perpendicular to the active layer, and only in the interelement regions of the structure, the structural layer having an intermediate index of refraction between the index of refraction of the cladding layers and the index of refraction of the substrate, to provide transverse antiguiding in the interelement regions;

wherein the wide-waveguide region has a length sufficient to support a single lateral mode in the wide-waveguide section;

and wherein the individual waveguides in one set are not colinar with waveguides in the other set, to favor selection of only the lowest of the higher-order array modes of operation.

6. A semiconductor laser array structure as defined in claim 5 wherein:

the two sets of waveguides in each set have substantially equal individual widths and have substantially equal periodic waveguide spacings measured across the waveguides of a set.

7. A semiconductor laser array structure as defined in claim 5, wherein:

the structural layer providing transverse antiguiding is transparent, to provide strong interelement coupling, and stability of operation.

8. A semiconductor laser array structure as defined in claim 5, and further comprising:

selective phase-shifting means positioned at the emitting facet to correct the phase of selected elemental outputs.

9. A semiconductor laser array structure as defined in claim 5, wherein:

the structure is formed by a liquid-phase epitaxy (LPE) process.

10. A semiconductor laser array structure as defined in claim 5, wherein:

the structure is formed by a metal-organic chemical vapor deposition (MOCVD) process.

* * * * *